(12) United States Patent
Frolov

(10) Patent No.: US 11,471,962 B2
(45) Date of Patent: Oct. 18, 2022

(54) SIGNAL SWITCH FOR POWER TOOLS

(71) Applicant: Robert Bosch GmbH, Stuttgart (DE)

(72) Inventor: Andrew Frolov, Glenview, IL (US)

(73) Assignee: Robert Bosch GmbH, Stuttgart (DE)

( * ) Notice: Subject to any disclaimer, the term of this patent is extended or adjusted under 35 U.S.C. 154(b) by 384 days.

(21) Appl. No.: 16/778,415

(22) Filed: Jan. 31, 2020

(65) Prior Publication Data

US 2021/0162523 A1 Jun. 3, 2021

Related U.S. Application Data

(60) Provisional application No. 62/942,812, filed on Dec. 3, 2019.

(51) Int. Cl.
| | | |
|---|---|---|
| *H01H 23/00* | (2006.01) | |
| *H05K 1/18* | (2006.01) | |
| *B23D 59/00* | (2006.01) | |
| *H01H 23/24* | (2006.01) | |
| *H01H 23/06* | (2006.01) | |
| *B23D 45/06* | (2006.01) | |

(52) U.S. Cl.
CPC ......... *B23D 59/001* (2013.01); *B23D 45/062* (2013.01); *H01H 23/006* (2013.01); *H01H 23/06* (2013.01); *H01H 23/24* (2013.01); *H05K 1/18* (2013.01); *H01H 2231/048* (2013.01); *H05K 2201/10053* (2013.01); *H05K 2201/10189* (2013.01)

(58) Field of Classification Search
CPC .. B23D 59/001–45/062; H01H 23/006; H01H 23/06; H01H 23/24–2231/048; H05K 1/18–2201/10189; H05K 1/10053
See application file for complete search history.

(56) References Cited

U.S. PATENT DOCUMENTS

| | | | | |
|---|---|---|---|---|
| 3,958,090 A | * | 5/1976 | Garcia ................. | H01H 23/006 200/277.2 |
| 4,031,345 A | * | 6/1977 | Garcia ................. | H01H 23/006 200/277.2 |
| 4,482,792 A | * | 11/1984 | Geremia ............... | H01H 23/06 200/284 |
| 6,713,693 B1 | * | 3/2004 | Sadowski ............. | H01H 25/00 200/18 |
| 7,026,565 B1 | * | 4/2006 | Lee ...................... | H01H 23/205 200/5 R |
| 10,490,371 B2 | * | 11/2019 | Weh ...................... | H01H 21/22 |

* cited by examiner

*Primary Examiner* — Vanessa Girardi
(74) *Attorney, Agent, or Firm* — Maginot, Moore & Beck LLP

(57) ABSTRACT

A signal switch for a power tool has a paddle supported by a rocker that extends into a switch housing to pivot an actuating member. A circuit board is attached to a bottom of the switch. At least one micro-switch extends from the circuit board into the switch in position to be actuated by the actuating member depending on a position of the paddle. The circuit board includes a connector that is configured to connect to a cable, such as a ribbon cable. Circuit traces on the circuit board are electrically connected to the micro-switches and the electrical connector. The interior of the switch housing is sealed from the exterior environment so that the mechanical components of the switch are shielded from the environment.

10 Claims, 9 Drawing Sheets

SIGNAL SWITCH FOR POWER TOOLS

CROSS-REFERENCE TO RELATED APPLICATIONS

This application claims priority to U.S. Provisional Application Ser. No. 62/942,812 entitled "SIGNAL SWITCH FOR POWER TOOLS" by Andrew Frolov, filed Dec. 3, 2019, the disclosure of which is hereby incorporated herein by reference in its entirety.

TECHNICAL FIELD

This application is related generally to power tools, and, in particular, to power switches for power tools.

BACKGROUND

Some power tools and other types of devices have specific requirements for the power switch, or ON/OFF switch. For example, for power tools, such as table saws, the user should not be able to turn on the power tool unintentionally. The switch should also be able to turned off blind, i.e., without requiring that the user see the switch to turn it off, and should be able to be turned off with by hand, knee or other body part of the user.

In general, two types of switches are widely used for table saws and similar types of power tools. One type of switch is a rocker switch having a large paddle lever as depicted in FIGS. 5 and FIG. 6. Another type of switch is a push button switch with two buttons (ON/OFF) provided on a large pad as depicted in FIG. 7. Issues faced by power switches of power tools is the build-up of oxidation on exposed conductors which can shorten service life. The electrical switches for power tools which receive power from an AC outlet are less susceptible to oxidation due to the high AC voltage and current flowing through the switch contacts which prevents the build-up of oxidation. However, battery-operated power tools typically have a very small DC voltage and current flowing through the contacts which may not be sufficient to prevent the build-up of oxidation. Harsh environments, such as high temperature and humidity, can exacerbate this problem.

Oxidation of contacts and harsh environments have more of an impact on battery-operated tools. Battery-operated tools often use micro-switches which can handle the DC voltage and current and are IP rated so they are protected from harsh environments. However, it is difficult to utilized micro-switches in power tools, such as table saws, which are configured to be actuated blindly by bumping the switch with a hand, knee or other body part. For example, the typical switches for table saws can generate a significant amount of kinetic energy which is transferred to the contacts by the switch lever when the switch is closed. Micro-switches could easily be damaged if actuated in this manner.

What is needed is a configuration of switch that enables micro-switches to be used in power switches for power tools, such as table saws, while still allowing blind actuation by hand, knee or other body part and that is not susceptible to oxidation and harsh environments.

SUMMARY

A signal switch for a power tool is provided that includes a lower housing assembly having a plurality of sidewalls that are connected to together to define an interior space, and a bottom wall that is attached to a bottom portion of the plurality of sidewalls and that covers a bottom portion of the interior space, the bottom wall defining at least one opening. An actuating member having a first end and a second end is pivotably supported within the interior space. The signal switch also includes an upper housing assembly having an upper wall that is attached to a top portion of the plurality of sidewalls and that covers the upper portion of the interior space. A paddle extends through an opening in the upper wall. The paddle has an arm located in the interior space. A rocker mechanism is configured to enable the paddle to be pivoted between an ON position and an OFF position. A spring-loaded pressing member is provided on an end of the arm. The signal switch also includes a micro-switch circuit board attached to the bottom wall. At least one micro-switch is provided on an inner side of the circuit board in position to extend through the at least one opening in the bottom wall and protrude into the interior space. At least two micro-switches may be used to fulfill safety requirements. An electrical connector is provided on an outer side of the circuit board that is configured to connect to an electrical cable. Circuit traces on the circuit board are electrically connected to the micro-switches and the electrical connector. When the paddle is in the ON position, the arm is positioned such that the pressing member presses the second end of the actuating member into engagement with the at least one micro-switch protruding into the interior space. When the paddle is on the OFF position, the arm is positioned such that the pressing member presses the first end of the actuating member downwardly which moves the second end of the actuating member away from the at least one micro-switch.

DETAILED DESCRIPTION

For the purpose of promoting an understanding of the principles of the device described herein, reference is made to the embodiment(s) illustrated in the figures and described in the following written specification. It is understood that no limitation to the scope of the device is thereby intended. It is further understood that the device includes any alterations and modifications to the illustrated embodiment(s) and includes further applications of the principles of the device as would normally occur to one of ordinary skill in the art to which this device pertains.

The present disclosure is directed to a power switch for a power tool, such as a table saw, that enables micro-switches to be used as an ON/OFF power switch for the power tool, while still allowing easy/blind actuation with a hand, knee or other body part of a user and that is not susceptible to oxidation and harsh environments. As discussed below, the power switch has a rocker switch configuration with micro-switches extended into the switch to be actuated by the rocker. The micro-switches are provided on a circuit board that is mounted on the bottom of the switch. The circuit board has circuit traces which connect the micro-switches a connector provided on the circuit board. The connector enables a cable, such as a ribbon cable, to be used to provide signal from the switch to the signal board and from signal board to main board of the power tool. The interior of the switch housing is sealed from the exterior environment so that the mechanical components of the switch are shielded from the environment.

Figure 1:
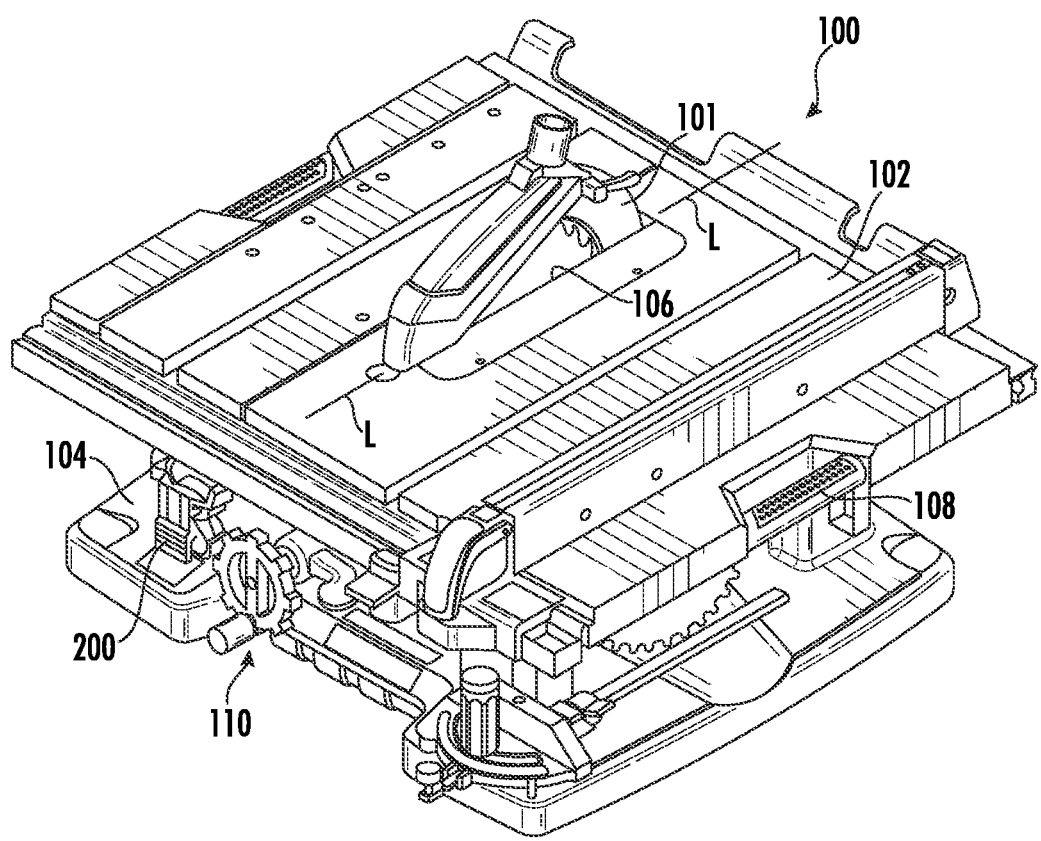
FIG. 1 is a perspective view of a table saw including a signal switch in accordance with the present disclosure.
Figure 2:
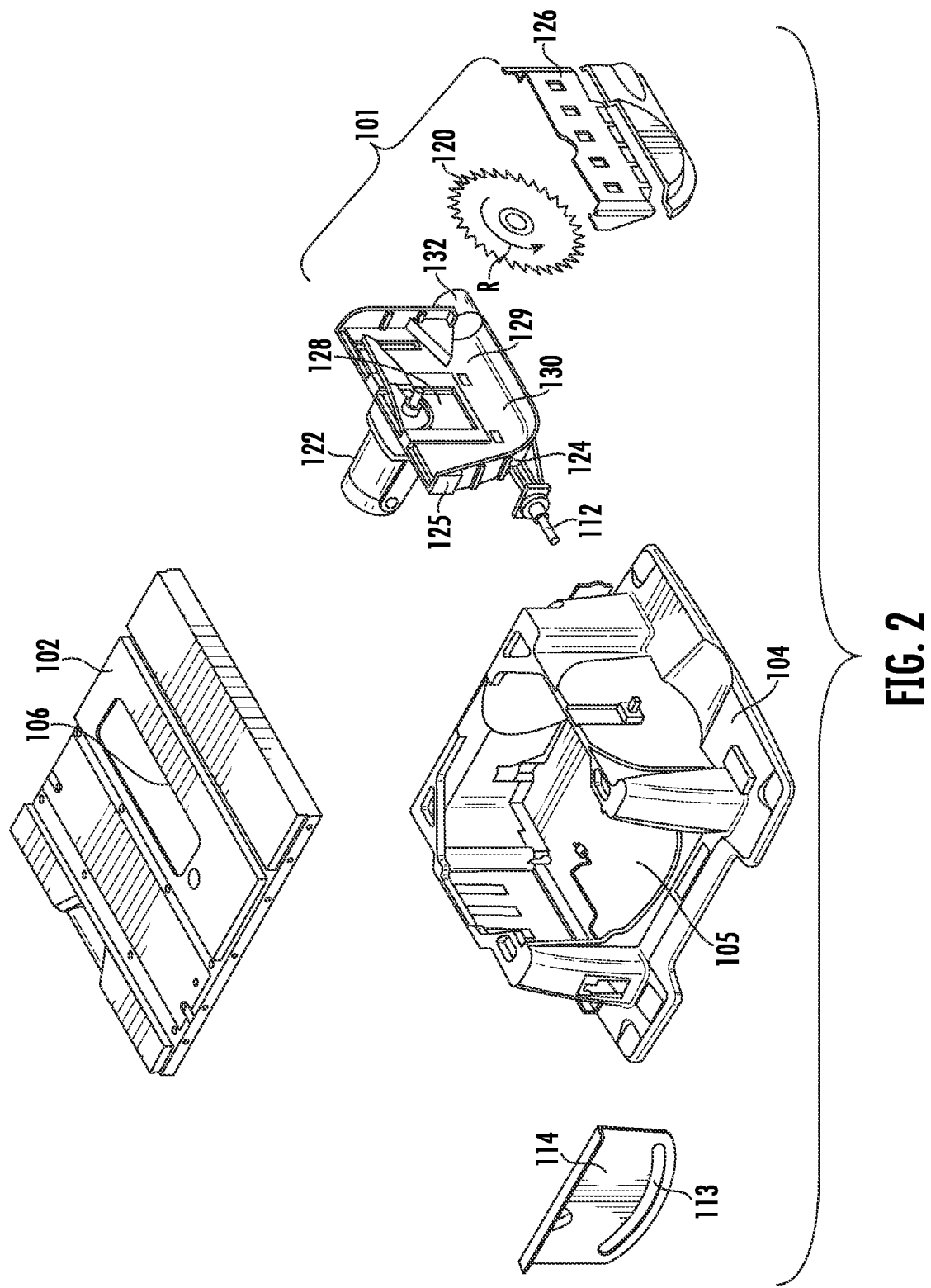
FIG. 2 is an exploded view of certain components of the table saw of FIG. 1.

In the embodiment described herein, the power tool comprises a table saw although the power switch may be used with any type of power tool or device. Referring to FIG. 1, the table saw assembly 100 includes a base 104 and table top 102. As shown in FIGS. 1 and 2, a power tool in the form of a table saw 100 includes a blade assembly 101, a table structure 102 and a base 104. The table 102 includes an opening or slot 106 through which a top portion of the blade assembly 101 extends. The table 102 has a generally planar upper surface, which may be referred to as a work surface. The frame 104 is connected to a bottom portion of the table 102 and is configured to define an internal space 105 in which the bottom portion of the blade assembly 101 is positioned. In the embodiment of FIG. 1, the table structure 102 and frame 104 may be formed from sheet metal, plastic, aluminum, composite materials, or the like. The table 102 and frame 104 may include handles, such as handle 108, which enable a user to carry the table saw 100 conveniently.

In certain embodiments, the blade assembly 101 has a fixed position along the longitudinal axis L of the table 102 or along the length of the slot 106. In other embodiments, the blade assembly 101 may be mounted to a slide assembly (not shown) that enables the blade assembly longitudinally relative to the table 102, commonly referred to as a "push-pull" saw.

The blade assembly 101 of the table saw 100 includes an adjustment mechanism 110 for adjusting the angular and vertical position of the blade. The mechanism 110 is adapted to permit rotation of the blade assembly 101 about the longitudinal axis L so that the blade can make an oblique cut in the workpiece. The mechanism may be further adapted to raise and lower the cutting blade relative to the table 102 to adjust the depth of the cut into the workpiece.

As shown in FIG. 2, the blade assembly 101 generally includes a blade 120, an electrical motor assembly 122, and a carriage assembly 124 including a cover assembly 126. The carriage assembly 124 includes a pivot mount 125 that is pivotably mounted to the underside of the table 102 to permit pivoting of the blade assembly, and thus the blade 120, about the longitudinal axis L (FIG. 1). The motor assembly 122 is supported within a channel 128 in the carriage assembly configured to allow the motor assembly, and therefore the blade 120, to move up and down relative to the table 102 and slot 106. The blade 120 may be configured for rotary or reciprocating motion, depending upon the nature of the table saw 100, and the motor assembly 122 is configured to drive the blade in the rotary motion.

The adjustment mechanism 110 incorporates a mechanism for controlled pivoting of the carriage assembly 124 relative to the table 102, and for controlled up and down movement of the motor assembly 122 relative to the table, which ultimately provides for controlled positioning of the cutting blade 120. It can be appreciated that a variety of adjustment mechanisms may be utilized to provide the angular and up-down adjustments for the blade 120. For instance, a lead screw mechanism may be provided to move the motor assembly 122, and thus the blade 120, up and down relative to the carriage assembly 124 and thus relative to the table 102 and work surface. The angular adjustment mechanism may incorporate a shaft 112 engaged within a curved slot 113 in a side wall 114 of the frame 104. The shaft 112 may form part of a gear mechanism for driving the height adjustment lead screw. Other mechanisms are contemplated provided they are at least capable of adjusting the angle of the blade 120 relative to the table 102 and slot 106.

A signal switch 200 in accordance with the present disclosure is provided on a front portion of the table saw 100 where it can be easily accessed by a user during operation of the table saw. The power signal is preferably a low voltage signal although any voltage and/or current level may be used for the power signal. The power signal is used to signal to the control system when to activate and deactivate the table saw, and is not used to supply power to the control system.

Figure 4:
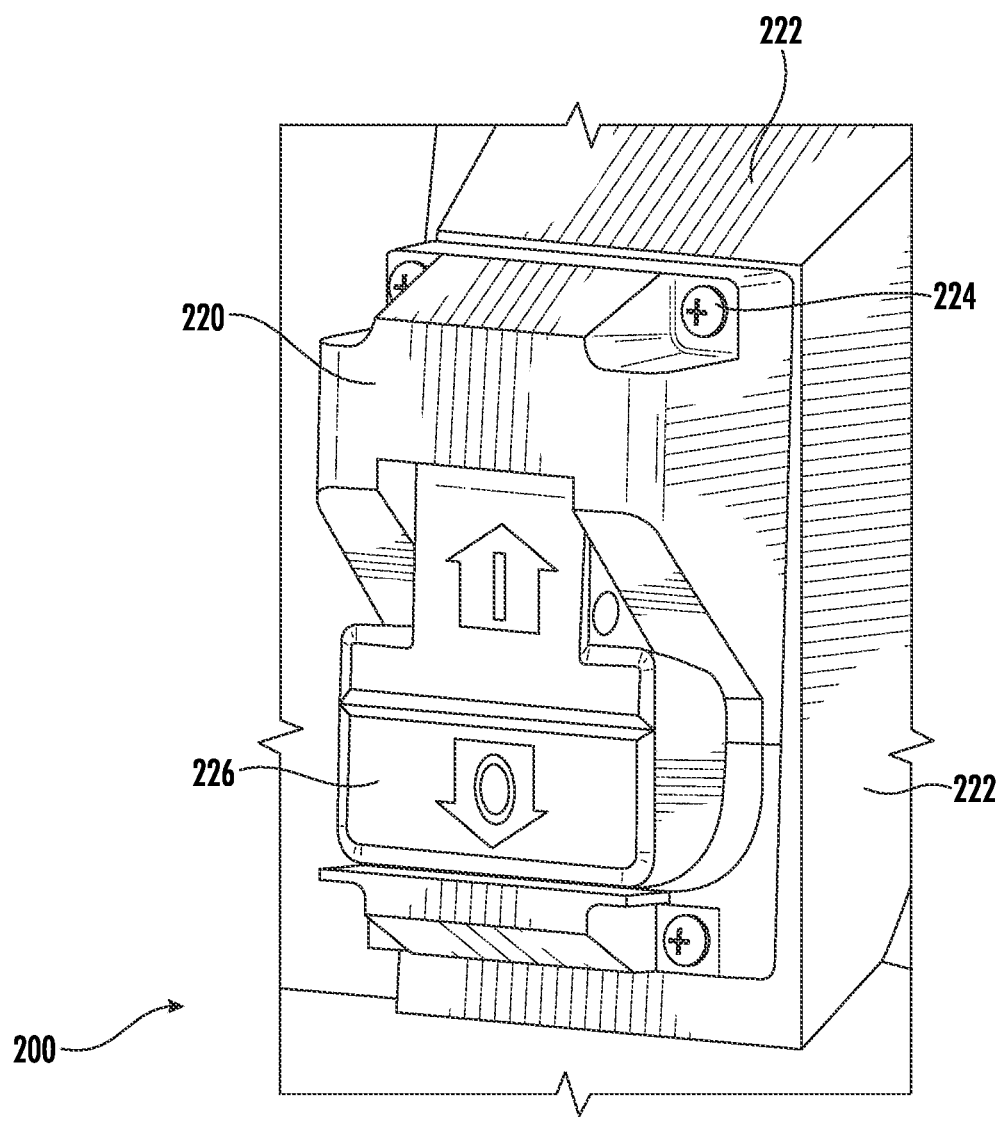
FIG. 4 is a fragmentary perspective view showing the power switch of the table saw of FIG. 1.
Figure 5:
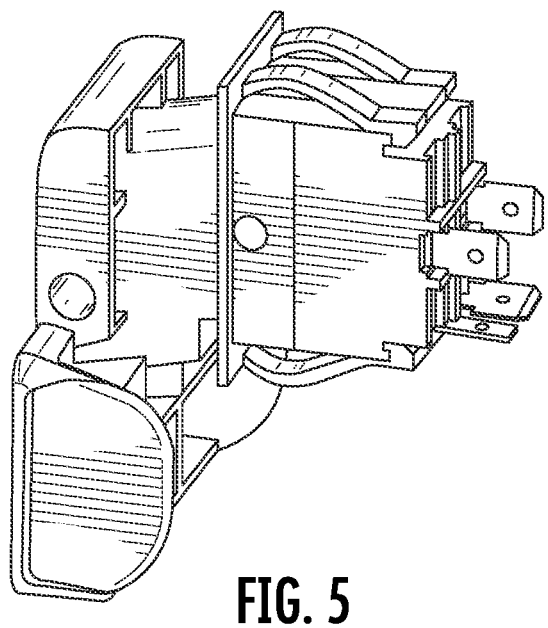
FIGS. 5-7 show embodiments of power switches according to the prior art.
Figure 6:
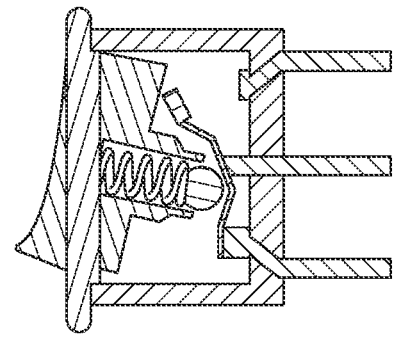
Figure 7:
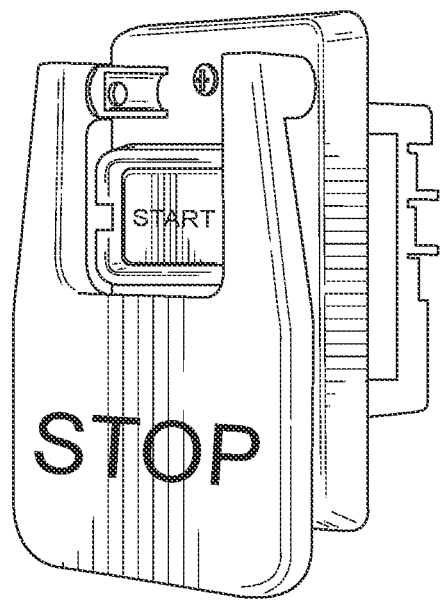
Figure 8:
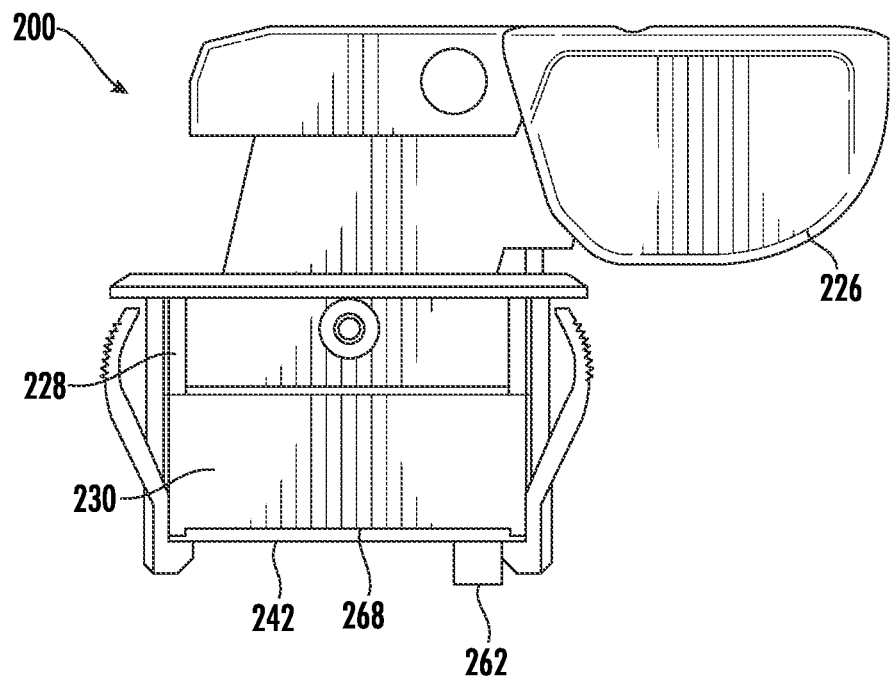
FIG. 8 is an elevational view of a signal switch in accordance with the present disclosure.
Figure 9:
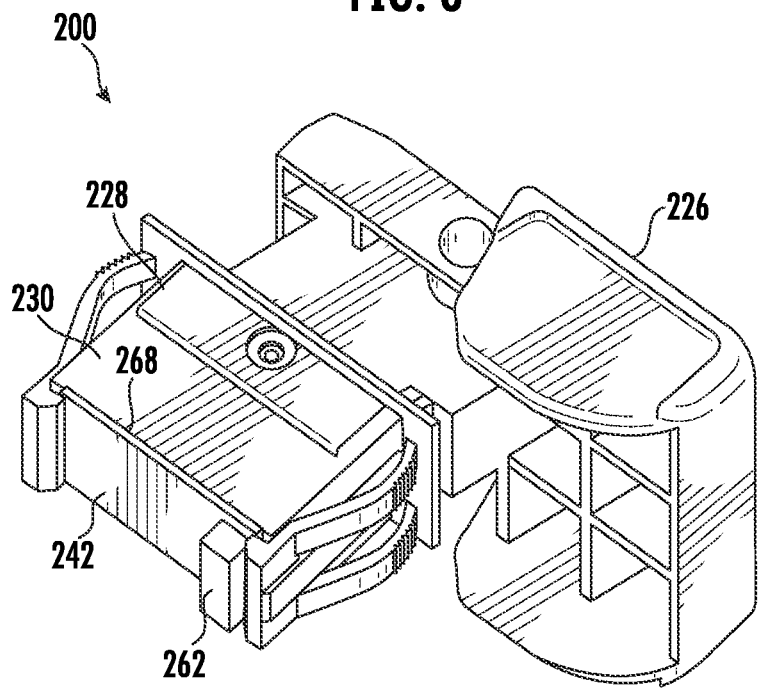
FIG. 9 is a bottom perspective view of the signal switch of FIG. 8.
Figure 10:
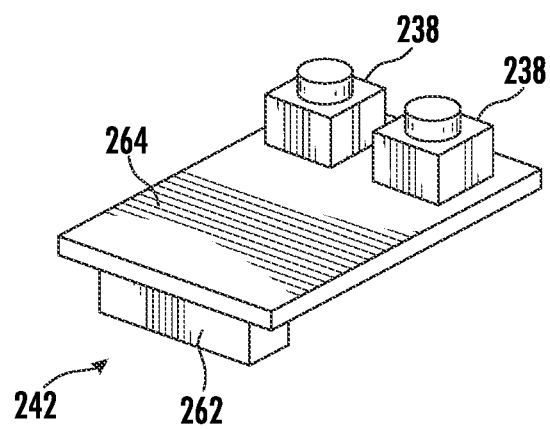
FIG. 10 is a perspective view of the micro-switch circuit board of the signal switch of FIG. 8.

Referring to FIG. 4, the signal switch 200 includes a housing 220 which is attached to the housing 222 of the power tool. The switch housing 220 is attached to the power tool housing by fasteners 224, such as screws. The switch 200 includes a paddle 226 which is used to open and close a circuit that supplies the power signal to the control system. The circuit may receive power from the interface circuit power distribution system or connects the signal to the control system.

Figure 3:
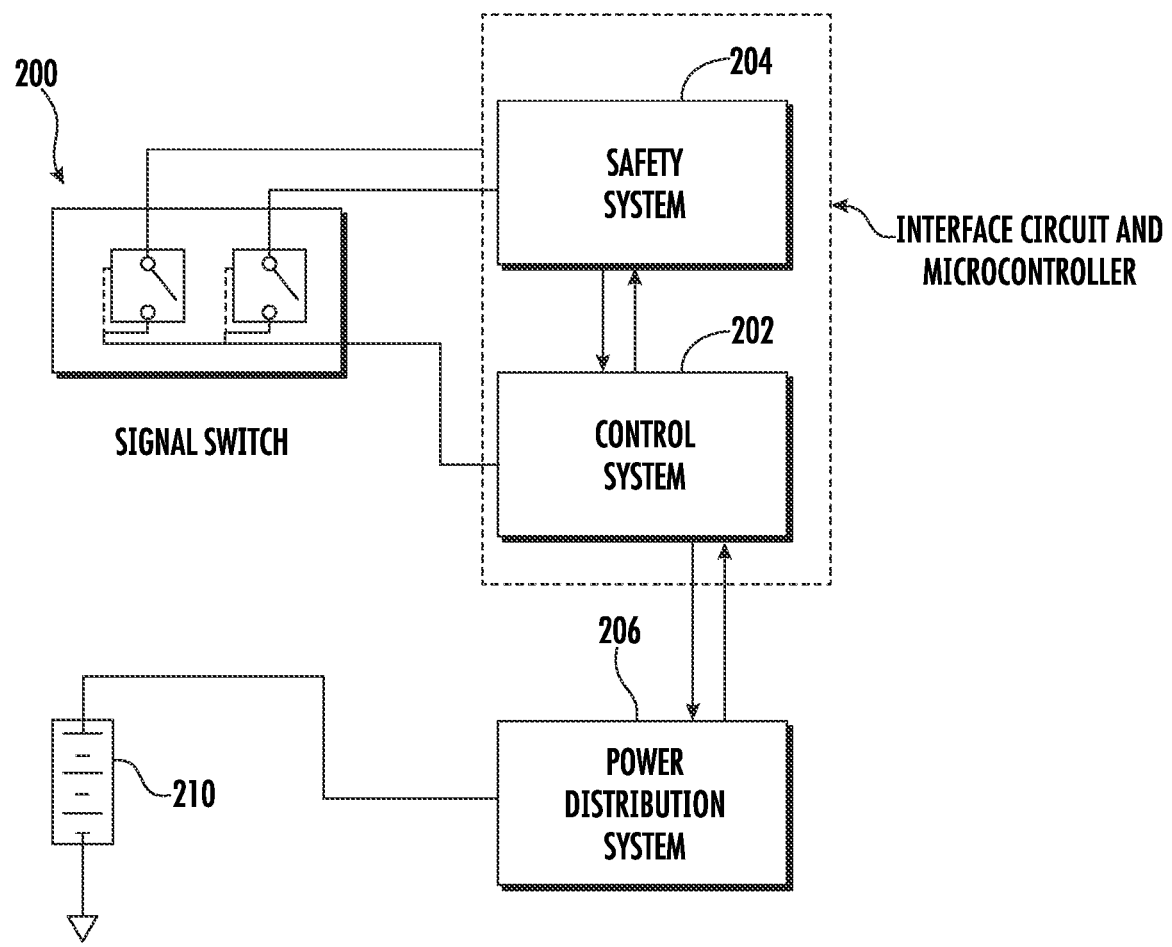
FIG. 3 is a schematic depiction of the electrical system of the table saw of FIG. 1.

An embodiment of an electrical system is depicted schematically in FIG. 3. The electrical system includes a control system 202, safety system 204, and a power distribution system 206. The control system 202 includes the components used to control the table saw, such as a processor, memory and the like. The control system 202 may be implemented on a printed circuit board (PCB). The safety system 204 includes electrical components and circuits which are configured to detect conditions of operation which could result in damage to the saw or to an operator of the tool and to implement strategies to prevent such damage, such as by stopping the blade, cutting off power, etc. The safety system 204 may be implemented on the same PCB or a separate PCB from the control system. The power distribution system 206 includes the components and circuitry that provide power to the drive system of the power tool.

The power is provided by a power supply 210. The power supply may be an AC outlet or battery. In the embodiments described herein, the power tool is a table saw that is battery-operated so the power source 210 depicted in FIG. 3 is a battery. The signal switch 200 is configured to manually open and close the signal circuit to indicate to the control system 202 when to supply power or cut off power to the various systems of the power tool.

FIGS. 8-12 depict an embodiment of the signal switch 200 in greater detail. The signal switch 200 includes an upper housing assembly 228 and a lower housing assembly 230.

The lower housing assembly 230 includes a plurality of sidewalls which surround and define an interior space. The upper housing assembly 228 is mounted on top of the lower housing assembly 230 and closes the upper portion of the interior space. The lower housing assembly 230 includes a bottom wall 232 (FIG. 11) which closes the bottom portion of the interior space.

Figure 11:
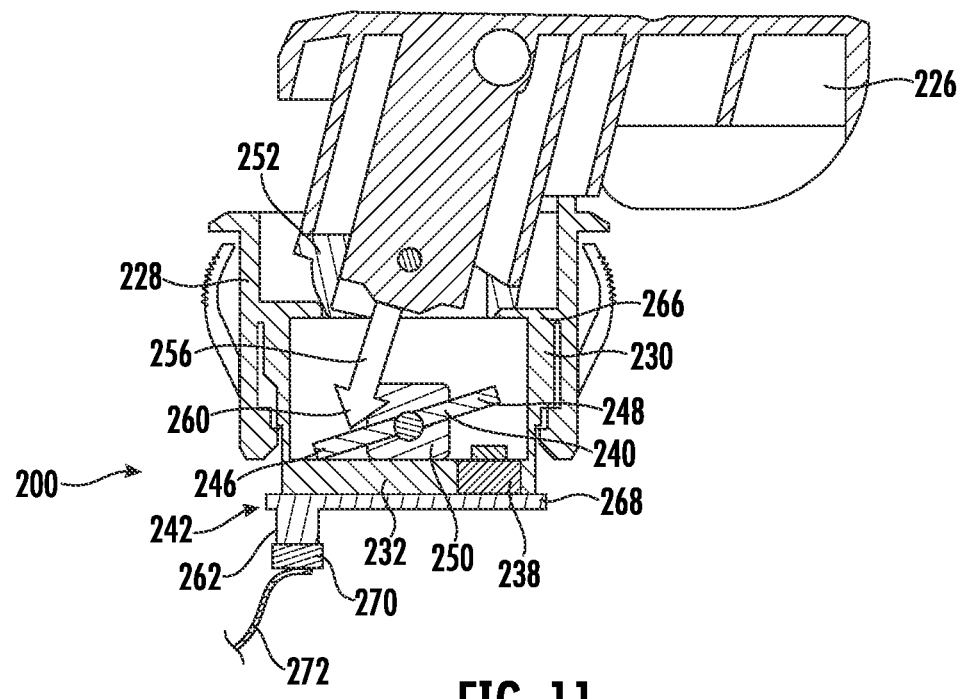
FIG. 11 is a schematic cross-sectional view of the signal switch of FIG. 8 with showing the switch in the OFF position.
Figure 12:
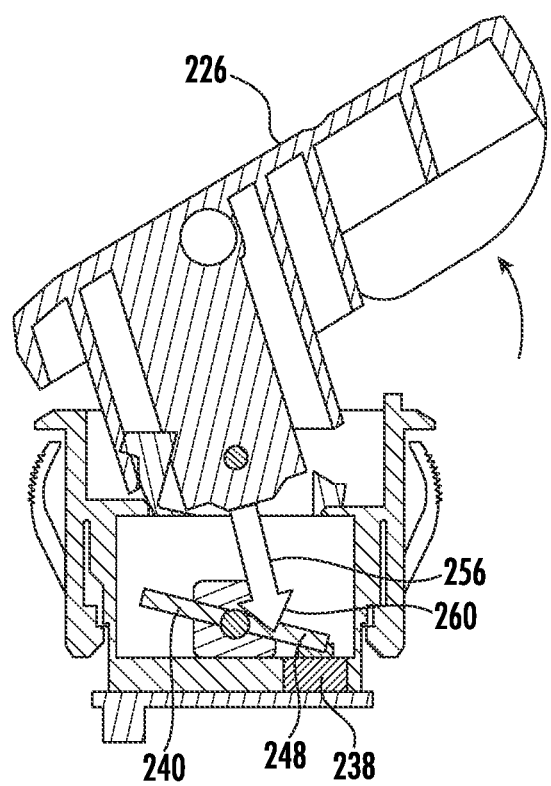
FIG. 12 is a schematic cross-sectional view of the signal switch of FIG. 8 with showing the switch in the ON position.

As can be seen in FIGS. 11 and 12, the bottom wall 232 defines openings through which the micro-switches 238 for the signal switch 200 are extended into the interior space. The number of micro-switch openings 236 depends on the number of micro-switches 238 utilized. As depicted, two micro-switches 238 are utilized so two openings are provided in the bottom wall 232. An actuating member 240 for actuating the micro-switches 238 is provided in the interior space of the lower housing assembly 230. The micro-switch circuit board 242 is mounted to the lower housing assembly 230 over the bottom wall 232. The micro-switch circuit board 242 may be implemented as a printed circuit board assembly (PCBA) and may be mounted onto the lower housing assembly 230 in any suitable manner.

The micro-switches 238 are provided on the upper side of the circuit board 242 in positions to extend through the corresponding openings 236 provided in the bottom wall 232 of the lower housing assembly 230. Two micro-switches 238 are utilized in the embodiment of FIGS. 8-12 although any suitable number of micro-switches may be used. The micro-switches 238 protrude into the interior space of the lower housing assembly 230 a sufficient amount to enable actuation by the actuating member 240. In one embodiment, the micro-switches 238 are configured to extend into the interior space such that only the actuating buttons on top of the switches 238 protrude above the inner surface of the bottom wall 232, as can be seen in FIGS. 11 and 12.

The actuating member 240 is pivotably supported in position to actuate the micro-switches 238, e.g., by pressing the buttons on top of the micro-switches 238. The actuating member 240 includes a first end 246 and a second end 248. The actuating member 240 is pivotably supported on the bottom wall by a pivot assembly 250 in a position where one end, e.g., the second end 248, of the actuating member 240 can be pivoted into and out of engagement with the micro-switches 238. In particular, the actuating member 240 is configured to pivot between a first position and a second position. In the first position, the second end 248 of the actuating member 240 is spaced apart from the micro-switches 238 so that the micro-switches 238 are not actuated, as depicted in FIG. 11. This corresponds to the OFF position for the signal switch. To pivot the actuating member to the second position, the second end of the actuating member 240 is pivoted downwardly into contact with the micro-switches 238, as depicted in FIG. 12. This corresponds to the ON position for the signal switch.

The upper housing assembly 228 includes the paddle 226, a rocker mechanism 252 and a spring assembly 254. The paddle 226 is manually moved by the user to turn the table saw on and off. The paddle 226 includes a large actuating portion to facilitate contact by the user. The actuating portion may also include markings, such as arrows, alphanumeric characters, and symbols, to indicate ON and OFF positions, directions of movement, or any other information to assist and guide a user.

The paddle 226 is attached to the upper housing assembly 228 by the rocker mechanism 252 which enables the paddle 226 to be pivoted between an OFF position (FIG. 11) and an ON position (FIG. 12). The rocker mechanism 252 may be configured in the same manner as a rocker switch as they are known in the art. In the OFF position, the paddle 226 is oriented downwardly and positioned close to the side of the power tool. The position and orientation of the paddle 226 in the OFF position is selected to substantially prevent and/or reduce the likelihood of the paddle inadvertent contact with the switch moving the paddle to the ON position.

The paddle 226 is pivoted outwardly from the side of the power tool to turn the power tool on. Referring to FIG. 12, in the ON position, the paddle 226 extends outwardly from the power tool to a position that is easily accessible during operation. The paddle 226 can then be easily moved to the OFF position by contacting the paddle with a hand, knee or other body part without having to see the paddle. The paddle 226 includes an arm portion 256 which extends into the interior space. A spring assembly is provided on the arm. For example, in one embodiment, the arm 256 comprises a hollow tube in which a pressing member 260, such as a ball or plunger is retained. A spring (not shown) is provided in the arm 256 to bias the pressing member to an extended position at which the pressing member protrudes from the end of the arm so it can resiliently bear against the actuating member 240.

When the paddle 226 is moved to the ON position as depicted in FIG. 12, the pressing member 260 is moved into engagement with the second end 248 of the actuating member 240 which causes the actuating member 240 to pivot into engagement with the micro-switches 238, thereby actuating the micro-switches. When the paddle 226 is moved to the OFF position as depicted in FIG. 11, the pressing member 260 is moved into engagement with the first end 246 of the actuating member 240 which causes the actuating member 240 to pivot to the non-actuating position at which the second end 248 of the actuating member 240 is spaced apart from the micro-switches 238.

The micro-switch circuit board 242 includes an electrical connector 262 and circuit traces 264. The circuit traces 264 are electrically connected to the micro-switches 238 and the electrical connector 262. The circuit traces 264 are used to route signal from the micro-switches 238 to the electrical connector 262. Although not depicted in FIGS. 8-12, other electrical components may be provided on the micro-switch circuit board 242 as needed to facilitate the handling and routing of signal through the micro-switch circuit board 242.

The electrical connector 262 is configured to connect to a complementarily configured connector 270 provided on a cable 272, such as a ribbon cable, or other suitable type of cable. As is known in the art, ribbon cables include a plurality of separate insulated conductors arranged in a flat, parallel manner. Connectors having a pre-specified configuration are provided on each end of the cable. The ribbon cable extends from the micro-switch circuit board and is connected by the other end of the cable to the signal board of main board of the table saw. The cable thus forms a part of the signal circuit for the table saw and enables signal to be simply and easily be routed from the switch to the systems of the power tool.

The interior space of the power switch is sealed from the exterior environment through the use of seals and sealing material in appropriate locations of the switch. For example, the signal switch 200 includes a seal 266 at the location where the paddle extends through the upper housing assembly 228 into the interior space. Sealant 268 is also provided to seal the interface between the micro-switch circuit board 242 and the lower housing assembly 230. Thus, the interior space is sealed from the environment which protects the mechanical components of the switch, such as the actuating member 240 and the buttons of the micro-switches 238 from dust and contamination.

Figure 13:
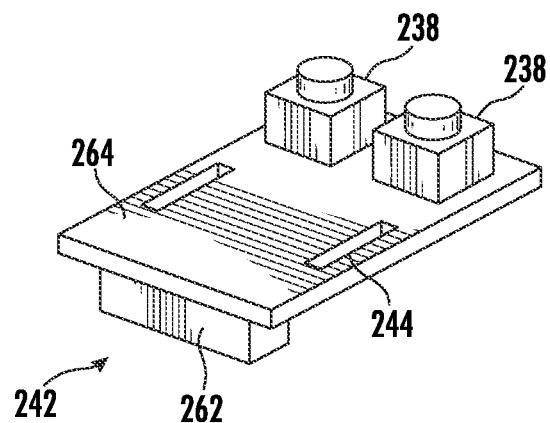
FIG. 13 is a perspective view of the micro-switch circuit board of a signal switch in accordance with another embodiment.
Figure 14:
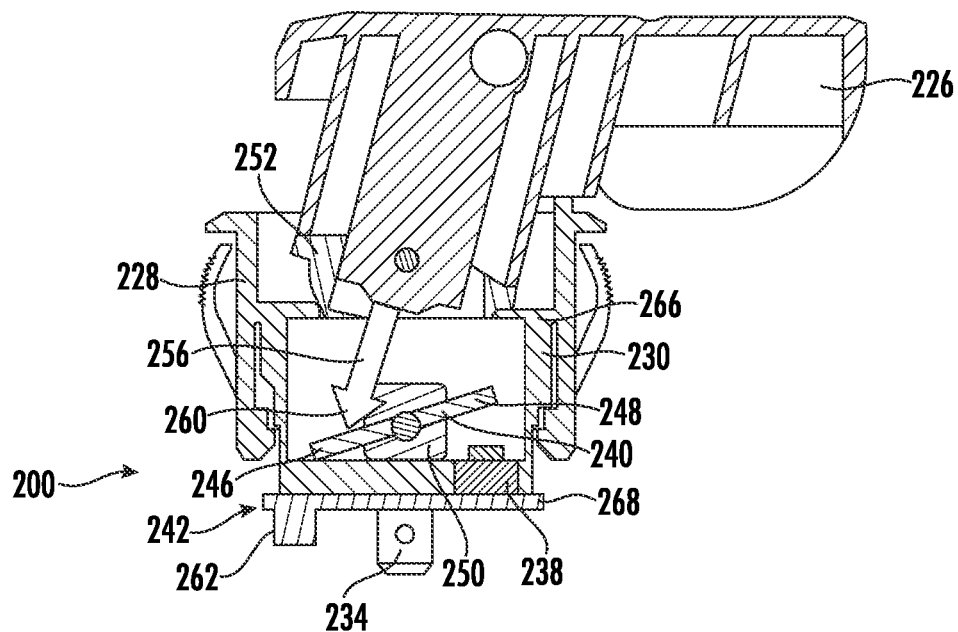
FIG. 14 is a schematic cross-sectional view of a signal switch of another embodiment having fixed terminals.

Referring to FIGS. 13 and 14, a signal switch 200 may be implemented by adding the circuit board and micro-switches to a rocker switch so the rocker assembly of the switch can be used to actuate the micro-switches. As can be seen in FIG. 14, the power switch may include fixed terminals which are mounted to the bottom surface of the bottom wall 232 and would have been used to connect the switch to a power circuit. The fixed terminals 234 may be used for accurate positioning of micro-switch circuit board. As best seen in FIG. 13, the micro-switch circuit board 242 may include openings or slots 244 through which the fixed terminals 234 extend for accurate positioning when the micro-switch circuit board 242 is mounted to the lower housing assembly 230.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A signal switch for a power tool, the signal switch comprising:
   a lower housing assembly including:
     a plurality of sidewalls that are connected to together to define an interior space;
     a bottom wall that is attached to a bottom portion of the plurality of sidewalls and that covers a bottom portion of the interior space, the bottom wall defining at least one opening;
     an actuating member pivotably supported within the interior space, the actuating member having a first end and a second end;
   an upper housing assembly including:
     an upper wall that is attached to a top portion of the plurality of sidewalls and that covers the upper portion of the interior space, the upper wall defining an opening;
     a paddle extending through the opening and having an arm located in the interior space;
     a rocker mechanism configured to enable the paddle to be pivoted between an ON position and an OFF position; and
     a spring-loaded pressing member on an end of the arm; and
   a micro-switch circuit board including:
     a circuit board attached to the bottom wall, the circuit board defining at least two slots through which the at least two fixed terminals extend;
     at least one micro-switch on an inner side of the circuit board and positioned to extend through the at least one opening in the bottom wall and protrude into the interior space;
     an electrical connector on an outer side of the circuit board, the electrical connector being configured to connect to an electrical cable; and
     circuit traces electrically connected to the micro-switches and the electrical connector,
   wherein, when the paddle is in the ON position, the arm is positioned such that the pressing member presses the second end of the actuating member into engagement with the at least one microswitch protruding into the interior space, and
   wherein, when the paddle is on the OFF position, the arm is positioned such that the pressing member presses the first end of the actuating member downwardly which moves the second end of the actuating member away from the at least one micro-switch.

2. The signal switch of claim 1, wherein the interior space is sealed from an exterior environment.

3. The signal switch of claim 1, wherein the electrical cable comprises a ribbon cable.

4. The signal switch of claim 1, wherein the power tool is a table saw.

5. The signal switch of claim 1, wherein the circuit traces are configured to route a signal from the at least one micro-switch to the electrical connector.

6. A power tool comprising:
   a tool member configured to perform work;
   a drive system configured to drive the tool member;
   a power source configured to provide power to the drive system;
   a power circuit that supplies power from the power source to the drive system;
   a signal switch electrically connected to the power circuit, the signal switch including:
     a lower housing assembly including:
       a plurality of sidewalls that are connected to together to define an interior space;
       a bottom wall that is attached to a bottom portion of the plurality of sidewalls and that covers a bottom portion of the interior space, the bottom wall defining at least one opening;
       an actuating member pivotably supported within the interior space, the actuating member having a first end and a second end;
     an upper housing assembly including:
       an upper wall that is attached to a top portion of the plurality of sidewalls and that covers the upper portion of the interior space, the upper wall defining an opening;
       a paddle extending through the opening and having an arm located in the interior space;
       a rocker mechanism configured to enable the paddle to be pivoted between an ON position and an OFF position; and
       a spring-loaded pressing member on an end of the arm; and
     a micro-switch circuit board including:
       a circuit board attached to the bottom wall,
       at least one micro-switch on an inner side of the circuit board and positioned to extend through the at least one opening in the bottom wall and protrude into the interior space;
       an electrical connector on an outer side of the circuit board, the electrical connector being configured to connect to an electrical cable; and
       circuit traces electrically connected to the micro-switches and the electrical connector; and
   a electrical cable having a first connecting end connected to the electrical connector and a second connecting end connected to signal board of a main power board of the power tool,
   wherein, when the paddle is in the ON position, the arm is positioned such that the pressing member presses the second end of the actuating member into engagement with the at least one microswitch protruding into the interior space, and
   wherein, when the paddle is on the OFF position, the arm is positioned such that the pressing member presses the first end of the actuating member downwardly which moves the second end of the actuating member away from the at least one micro-switch.

7. The signal switch of claim 6, wherein the interior space is sealed from an exterior environment.

8. The signal switch of claim 6, wherein the electrical cable comprises a ribbon cable.

9. The signal switch of claim 6, wherein the power tool is a table saw.

10. The signal switch of claim 6, wherein the circuit traces are configured to route signal from the at least one micro-switch to the electrical connector.

* * * * *